(12) United States Patent
Jang

(10) Patent No.: US 6,177,325 B1
(45) Date of Patent: Jan. 23, 2001

(54) SELF-ALIGNED EMITTER AND BASE BJT PROCESS AND STRUCTURE

(75) Inventor: Wen-Yueh Jang, Hsinchu (TW)

(73) Assignee: Winbond Electronics Corp. (TW)

( * ) Notice: Under 35 U.S.C. 154(b), the term of this patent shall be extended for 0 days.

(21) Appl. No.: 09/080,521

(22) Filed: May 18, 1998

(51) Int. Cl.$^7$ ................................................. H01L 21/331
(52) U.S. Cl. ........................... 438/318; 438/309; 438/364
(58) Field of Search ................................... 438/309, 312, 438/318, 320, 359, 364, 365, 366

(56) References Cited

U.S. PATENT DOCUMENTS 5,024,971 * 6/1991 Baker et al. .......................... 438/586
5,591,651 * 1/1997 Chen ..................................... 438/362

* cited by examiner

Primary Examiner—John F. Niebling
Assistant Examiner—Christopher Lattin
(74) Attorney, Agent, or Firm—Proskauer Rose LLP

(57) ABSTRACT

A process for forming a self-aligned BJT (bipolar junction transistor) is disclosed. Conventional front end processes are used to form an N$^+$ layer on a substrate. An N-type collector region is then formed followed by formation of isolation regions on the substrate surface. A deep collection connector region is formed by ion implantation into the N-well. Next, a P base region is formed by ion implantation. An undoped polysilicon (polycide) layer is then deposited on the surface of the substrate. Thereafter, a dielectric layer, which preferably cannot be oxidized, is deposited on top of the undoped polysilicon (polycide) layer. The dielectric layer is then patterned to form a dielectric emitter. Nitride spacers are then formed on the sidewalls of the dielectric emitter. The polysilicon (polycide) layer is then heavily doped with P-type impurities except in the area of the dielectric emitter and nitride spacers. An oxide layer is then grown on the surface of the P$^+$ doped polysilicon (polycide) layer and the nitride spacers are then removed. The oxide layer is also removed except from the emitter-base regions. Next, the dielectric emitter and thermally grown oxide layers are then used as a mask through which the P$^+$ polysilicon (polycide) layer is etched away. The dielectric emitter and thermally grown oxide layers are then removed. The narrow gaps, that have been etched between the polysilicon (polycide) layer and the undoped polysilicon (polycide) layer, are then filled with a dielectric. The undoped polysilicon (polycide) regions are then heavily doped with N-type impurities. The impurities are then thermally driven out from the polysilicon (polycide) layer to the silicon substrate. Lastly, the conventional back end processes are followed which include ILD layer deposition and planarization, contact opening, metal deposition and patterning.

4 Claims, 7 Drawing Sheets

US 6,177,325 B1

SELF-ALIGNED EMITTER AND BASE BJT PROCESS AND STRUCTURE

FIELD OF THE INVENTION

The present invention relates to semiconductor devices. In particular, the invention relates to a self-aligned bipolar junction transistor and a method for forming the same.

BACKGROUND OF THE INVENTION

A conventional bipolar junction transistor 10 is depicted in FIG. 1. The device is formed on a silicon substrate 12 which is illustratively P⁻ type. A buried N⁺ layer 14 is located on the substrate 12 and an N-type collector region 16 is located on buried N⁺ layer 14. In addition, a plurality of field oxide (FOX) regions 18 are formed on the substrate. An N⁺ deep connection region 20 connects the substrate surface to the buried N⁺ layer 14 to form a collector contact to collector 16. A P-type base region 22 is formed in the N-type well 16, which forms the collector. Two P⁺-type base contact regions 24 and 26 are formed on either side of the base 22.

The emitter 28 includes the N⁺ polysilicon or polycide region 30 formed on the surface of the substrate. The emitter 28 also includes the N diffusion region 29. Spacers, such as oxide spacers 32 and 34, are located on either side of the N⁺ polysilicon region 30. Two metal contacts 36 and 38 connect to the P⁺ base contact regions 24 and 26. A third metal contact 40 connects to the deep connector region 20 for contact with the N⁺ collector buried layer 14. A fourth metal contact 41 connects the surface to the emitter 28. Note that metal contacts 36, 38, 40 and 41 are formed in openings of an inter-layer-dielectric (ILD) layer 42.

The overall structure is an NPN transistor with N-type collector 16, P-type base 22 and N-type emitter 28. The buried N⁺ layer 14 and N⁺ deep connector 20 form a collector contact, whereas the P⁺ regions 24 and 26 form a base contact. Because the base contact regions do not connect directly to the P-type base regions 22, there is a parasitic resistor $R_b$ in series with the base of the BJT. The value of $R_b$ is determined by the P⁺ diffusion sheet resistance and the distance $L_1$ between the base contact and the emitter. In general, P⁺ diffusion sheet resistance cannot be improved significantly without affecting device characteristics. The distance $L_1$ depends on photo alignment tolerance between the polysilicon emitter and contact, and the metal contact process. Therefore $R_b$ can be reduced if $L_1$ is shortened. However, a distance $L_2$ is also needed to prevent contact of base metal regions 36 and 38 to the isolation regions, e.g. field oxide regions 18. The existence of $L_1$ and $L_2$ and the base contacts will enlarge the P⁺ diffusion regions 24 and 26 (to a depth of 0.3 μm and a width of 1.4 μm). Therefore, there exists a large base to collector capacitance $C_{bc}$. Capacitance $C_{bc}$ will degrade BJT device performance greatly since it is located between the input node and the output node in the CE (common emitter) configuration of the BJT.

To improve the BJT characteristics, a first proposed BJT 10' with a self-aligned base contact is formed using a process as depicted in FIG. 2. Using conventional front end processes, the N⁺ layer 14 is formed on the substrate 12. Further, the N-type collector region 16 is formed and then the field oxide (FOX) regions 18 are formed on the substrate surface. The deep collector connector region 20 is then formed by diffusion or ion implantation into the N-type well 16. Next, the P base region 22 is formed by diffusion or ion implantation. Thereafter, the P⁺ polysilicon interconnect links 54 and 56 are formed. Specifically, the interconnect links 54 and 56 are formed by depositing a polysilicon layer, patterning the polysilicon layer using photolithography and then etching. The P⁺ base contact regions 24 and 26 are formed by out-diffusion from the P⁺ polysilicon interconnect links 54 and 56. This forms a self-aligned link from the P base 22, through the P⁺ base contact regions 24 and 26, and through the P⁺ polysilicon regions 54 and 56 to the base metal contacts 36 and 38 (which are formed after ILD deposition).

Next the emitter 28 is formed by depositing an N⁺ polysilicon layer and patterning this layer to form the N⁺ polysilicon emitter region 30. The N⁺ emitter region 29 is formed by out-diffusion from the N⁺ polysilicon region 30. After this, the ILD layer 42 is formed and patterned to enable formation of the metal contacts 36, 38, 40 and 41.

From these steps the BJT 10' with the self aligned base contact is formed. Because the P base 22 is connected using the P⁺ polysilicon regions 54 and 56, the P⁺ base contact regions 24 and 26 can be made smaller than the P⁺ base contact regions in the conventional device of FIG. 1. Thus, the collector-base capacitance $C_{bc}$ in the device 10' of FIG. 2 is smaller than $C_{bc}$ in the device 10 of FIG. 1. Parasitic resistance $R_b$ can also be reduced by the low resistance P⁺ polycide base connectors.

However, the device 10' of FIG. 2 still has certain deficiencies. First of all, because two polysilicon (polycide) processes are used to achieve the self-aligned BJT, the entire process complexity is increased. Secondly, the P⁺ base contact regions 24 and 26 are formed before a thermal cycle is used to form the N⁺ emitter region 29 by out-diffusion from the N⁺ polysilicon region 30. This thermal cycle will cause the P⁺ impurities in the P⁺ regions 24 and 26 to out-diffuse, thereby enlarging the size of the P⁺ regions 24 and 26. This in turn can cause N⁺ emitter region (region 29) to P⁺ base contact region (regions 24 and 26) junction leakage. In addition, $C_{bc}$ will be increased due to the increase in the size of the P⁺ regions 24 and 26.

Moreover, because the P⁺ base contact regions 24 and 26 are formed by out-diffusion from the P⁺ links 54 and 56, only polysilicon or polycide can be used for these links and this results in a large base interconnection resistance. Furthermore, since the emitter width ($W_E$) is equal to the total diffusion area width ($W_1$) minus the partial width of the two P⁺ polycide base connectors ($W_{p1}+W_{p2}$) minus two times the spacer width (between the emitter 30 and P⁺ polycide base connectors 54 and 56), the emitter width cannot be easily controlled, adversely affecting BJT device characteristics.

To solve these issues a second proposed BJT 10" with a self-aligned base contact is formed using a process as depicted in FIG. 3. Using conventional front end processes, the N⁺ layer 14 is formed on the substrate 12. The N-type collector region 16 is formed and then the field oxide (FOX) regions 18 are formed on the substrate surface. The deep collector connector region 20 is then formed by diffusion or ion implantation into the N-type well 16. Thereafter, the base connector regions 54 and 56 and the emitter region 28 are formed by first depositing a polysilicon layer, patterning the polysilicon layer using photolithography and etching.

The distance $W_E$ is defined by the photolithographic process. The emitter region 28 includes the N⁺ polysilicon (polycide) region 30 formed on the surface of the substrate and the N⁺ diffusion region 29. Spacers, such as oxide spacers 32, are located on either side of the N⁺ polysilicon region 30. Impurities are thermally driven out of the emitter region 30 to form the N⁺ diffusion region 29 and out of the base contact regions 54 and 56 to form P⁺ diffusion areas 24 and 26, respectively. Two metal contacts 36 and 38 connect to the P+ base contact regions 24 and 26. A third metal contact 40 connects to the deep connector region 20 for contact with the N+ collector contact layer 14. A fourth metal contact 41 connects to the emitter 28. The metal contacts 36, 38, 40 and 41 are formed in openings of an ILD layer 42.

This polysilicon (polycide) process complexity is reduced as compared to the device of FIG. 2. However, some of the disadvantages, described above, remain. For instance, since the polysilicon (polycide) emitter 28 is patterned at the same time as the P+ polysilicon (polycide) base connectors 54 and 56, some spacing ($W_p$) must be left between these two regions. For instance, if a 0.35 μm BJT process is applied, then the resulting size of $W_p$ is approximately 0.4 μm. Therefore, in addition to $R_b$ there is an additional base series resistor $R_b'$. Note to that the P+ diffusion regions 24 and 26 will be enlarged due to the necessary spacing $W_p$, which will increase $C_{bc}$. In addition, the parasitic devices $R_b+R_b'$ and $C_{bc}$ are still too large to be used in high speed circuits.

It is therefore an object of the present invention to overcome the disadvantages of the prior art.

SUMMARY OF THE INVENTION

The present invention overcomes the deficiencies in the prior art. Specifically, an inventive self-aligned BJT and process is disclosed that is easily manufactured and reduces overall device size and effects of parasitic devices.

Conventional front end processes are used to form an N+ layer on a substrate. An N-type collector region is then formed followed by formation of isolation regions on the substrate surface. A deep collection connector region is formed by ion implantation into the N-well.

Next, a P base region is formed by ion implantation. An undoped polysilicon (polycide) layer is then deposited on the surface of the substrate. Thereafter, a dielectric layer, which preferably cannot be oxidized, is deposited on top of the undoped polysilicon (polycide) layer. The dielectric layer is then patterned to form a dielectric emitter. Nitride spacers are then formed on the sidewalls of the dielectric emitter. The polysilicon (polycide) layer is then heavily doped with P-type impurities, except in the area of the dielectric emitter and nitride spacers. An oxide layer is then grown on the surface of the P+ doped polysilicon (polycide) layer and the nitride spacers are removed. The oxide layer is also removed except from the emitter-base regions.

The dielectric emitter and thermally grown oxide layers are then used as a mask through which the P+ polysilicon (polycide) layer is etched away. Next, the dielectric emitter and thermally grown oxide layers are removed. The narrow gaps, that have been etched between the polysilicon (polycide) layer and the undoped polysilicon (polycide) layer, are then filled with a dielectric. The undoped polysilicon (polycide) regions are now heavily doped with N-type impurities. The impurities are then thermally driven out from the polysilicon (polycide) layer to the silicon substrate. Lastly, the conventional back end processes are followed which include ILD layer deposition and planarization, contact opening, metal deposition and patterning.

DETAILED DESCRIPTION OF THE INVENTION

The process for forming an embodiment of the present invention is illustrated in FIGS. 4 through 12.

Figure 4:
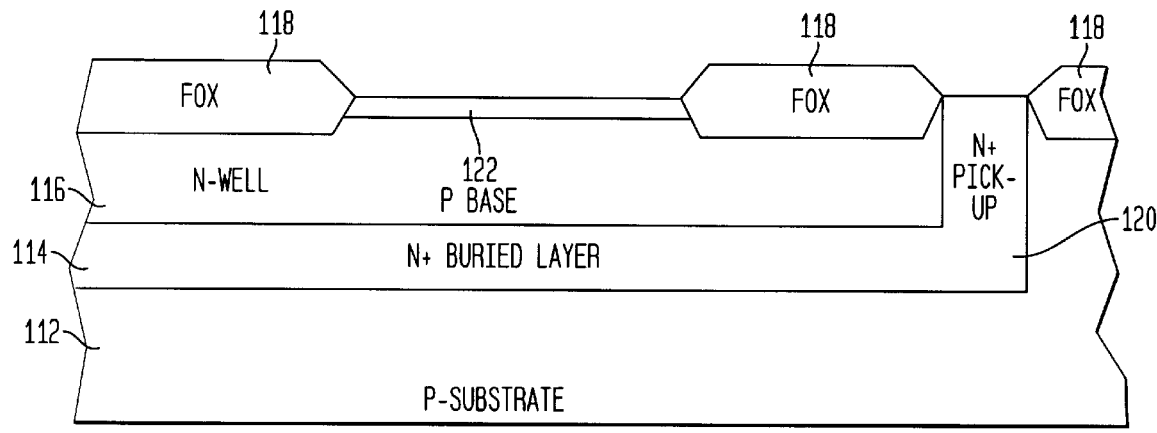
FIGS. 4, 5, 6, 7, 8, 9, 10, 11 and 12 illustrate a process for forming a BJT with a self-aligned aligned emitter and base in accordance with an illustrative embodiment of the present invention.

Using standard front end processes, an N+ layer 114 is first formed on a silicon substrate 112 as shown if FIG. 4. An N-type collector region (N-well) 116 is then formed and isolation regions 118, e.g. field oxide regions, are formed on the substrate surface. The deep collection connector region 120 is then formed by ion implantation into the N-well 116. Next, the P base region 122 is formed, also by ion implantation.

Figure 5:
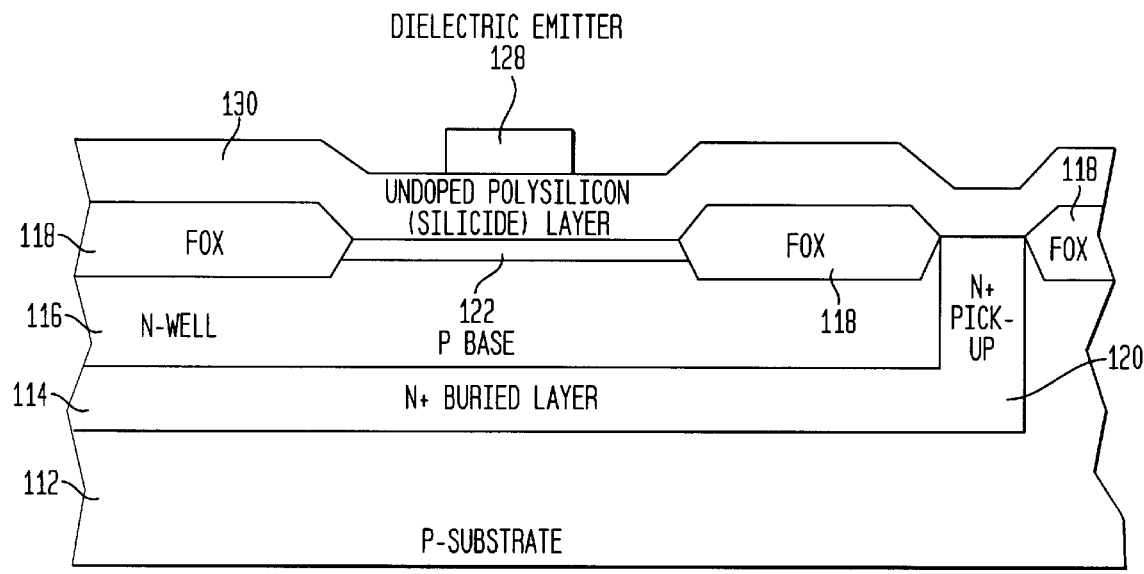

As shown in FIG. 5, an undoped polysilicon (polycide) layer 130 is deposited on the surface of the substrate to a thickness of 2000 Å. Next, a dielectric layer (which preferably cannot be oxidized) is deposited to a thickness of 2000 Å on top of the undoped polysilicon (polycide) layer 130. The dielectric layer is patterned to form the dielectric emitter region 128.

Figure 6:
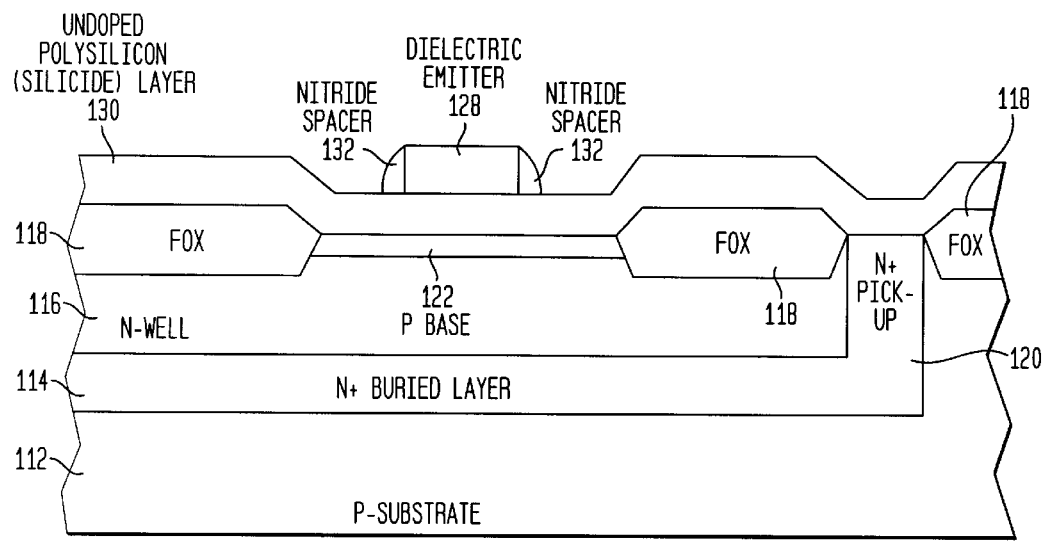
Figure 7:
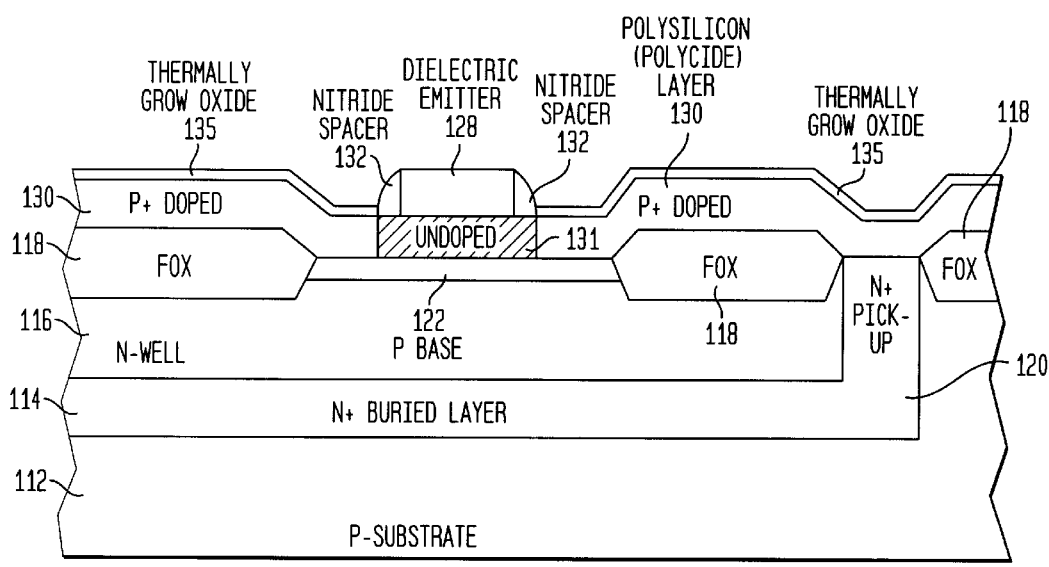

As shown in FIG. 6, $Si_3N_4$ (nitride) spacers 132 are formed, preferably having a width within the range of 0.3 μm to 0.1 μm or less, on the side walls of the dielectric emitter region 128. This is achieved by first depositing a nitride layer to a thickness of 2500 Å and then performing an anisotropic nitride etch to give the desired spacers 132. The polysilicon (polycide) layer 130 is then heavily doped with P-type impurities. The region 131, shown in FIG. 7, below the dielectric emitter region 128 and nitride spacers 132 is left undoped. A thin thermal oxide layer 135 is then grown on the surface of the P+ doped polysilicon (polycide) layer 130 as shown in FIG. 7. The thermal oxide layer 135 has a thickness of 200 Å which is less than the height of the dielectric emitter region 128. Because oxygen cannot penetrate through nitride, the polysilicon (polycide) region 131 below the nitride spacers 132 does not grow an oxide layer.

Figure 8:
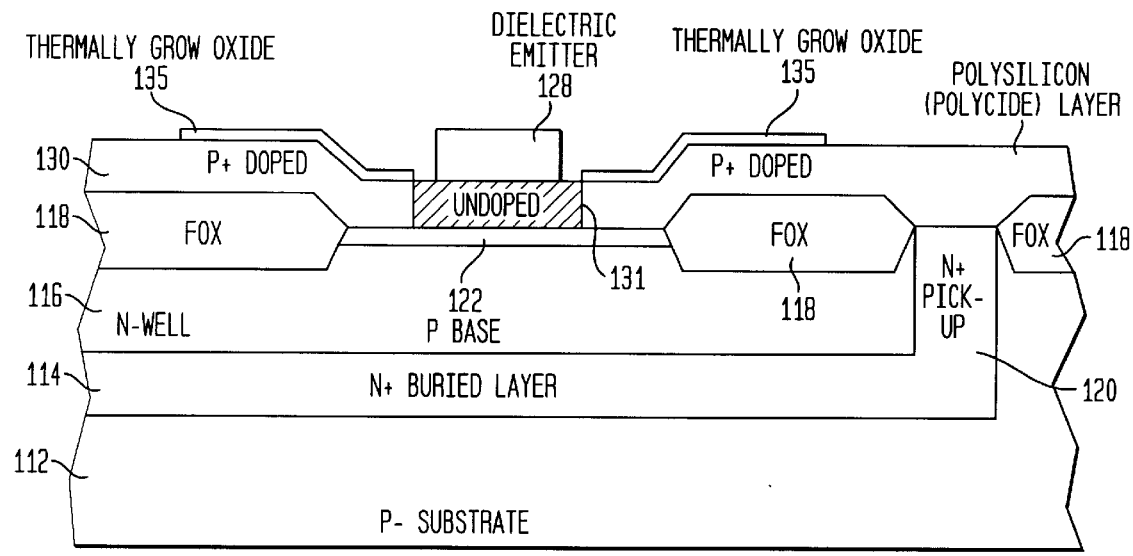
Figure 9:
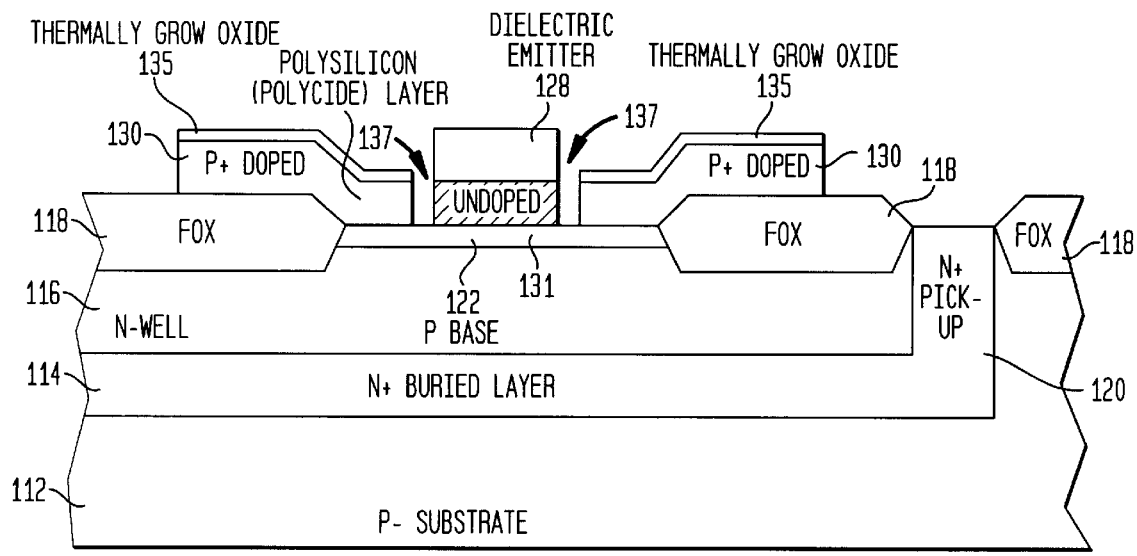
Figure 10:
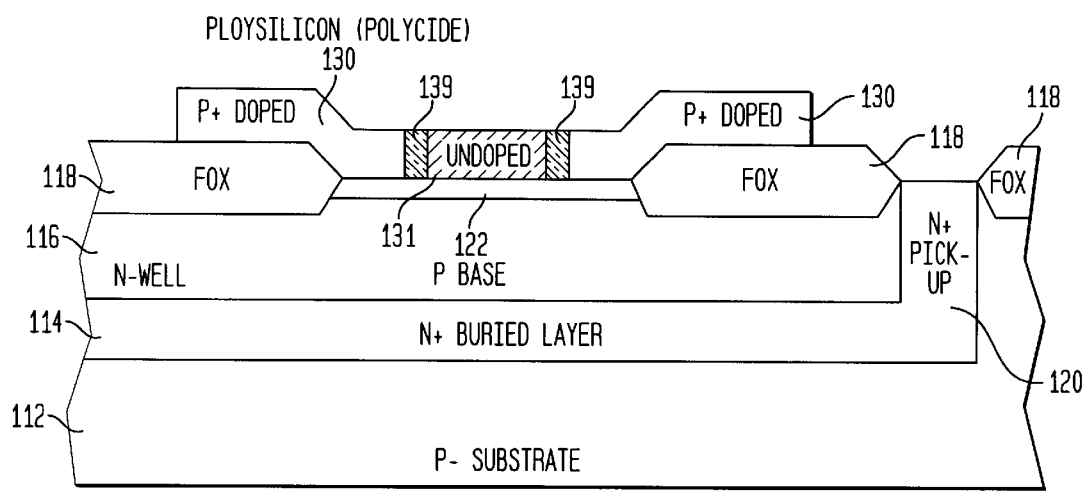

Next, the nitride spacers 132 are removed as shown in FIG. 8. The removal of the nitride spacers 132 is easily achieved due to the high etch selectivity between the oxide layer 135 and the nitride spacers 132. The dielectric emitter region 128 should also be chosen so as to have a high nitride etch selectivity. Portions of the oxide layer 135 are also removed from the polysilicon (polycide) layer 130 except over the emitter-base regions. The removal of the nitride spacers 132 and portions of the oxide layer 135 results in the dielectric emitter region 128 and remaining portions of the oxide layer 135 being patterned to form a mask. The resulting mask is shown in FIG. 8. An anisotropic silicon etch is then applied to the undoped polysilicon (polycide) layer 130, in the areas where the spacers were removed, resulting in trenches 137 shown in FIG. 9. The anisotropic silicon etch is also applied to the areas where portions of the oxide layer 135 are removed. The dielectric emitter region 128 and thermally grown oxide layers 135 are then removed. The trenches 137 that have been etched between the undoped polysilicon (polycide) layer 131 and the P+ doped polysilicon (polycide) layer 130 are then filled with a dielectric 139 such as $SiO_2$. The result is shown in FIG. 10.

Figure 11:
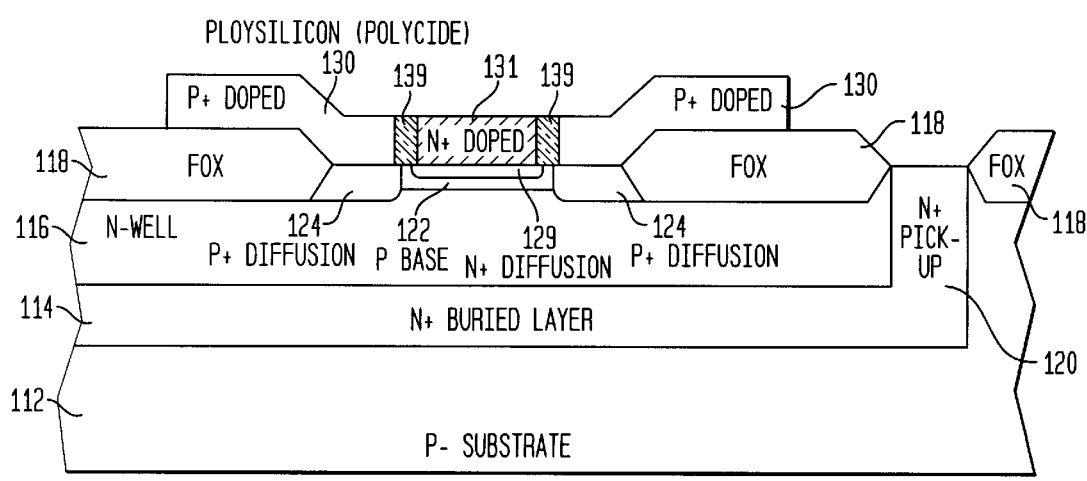

As shown in FIG. 11, the undoped polysilicon (polycide) region 131 is then heavily doped with N-type impurities. The impurities are then thermally driven out from the polysilicon (polycide) layer 130 and 131 to form P+ diffusion regions 124 and the N⁺ diffusion region 129. Because the thermal diffusivity coefficient of the P-type impurity is much higher than that of the N-type impurity, the junction depth of the P-type impurity is much deeper than that of the N-type impurity.

The conventional back end processes are then followed which include ILD layer deposition and planarization, contact opening, metal deposition and patterning. The result is the self-aligned bipolar junction transistor shown in FIG. 12.

Figure 12:
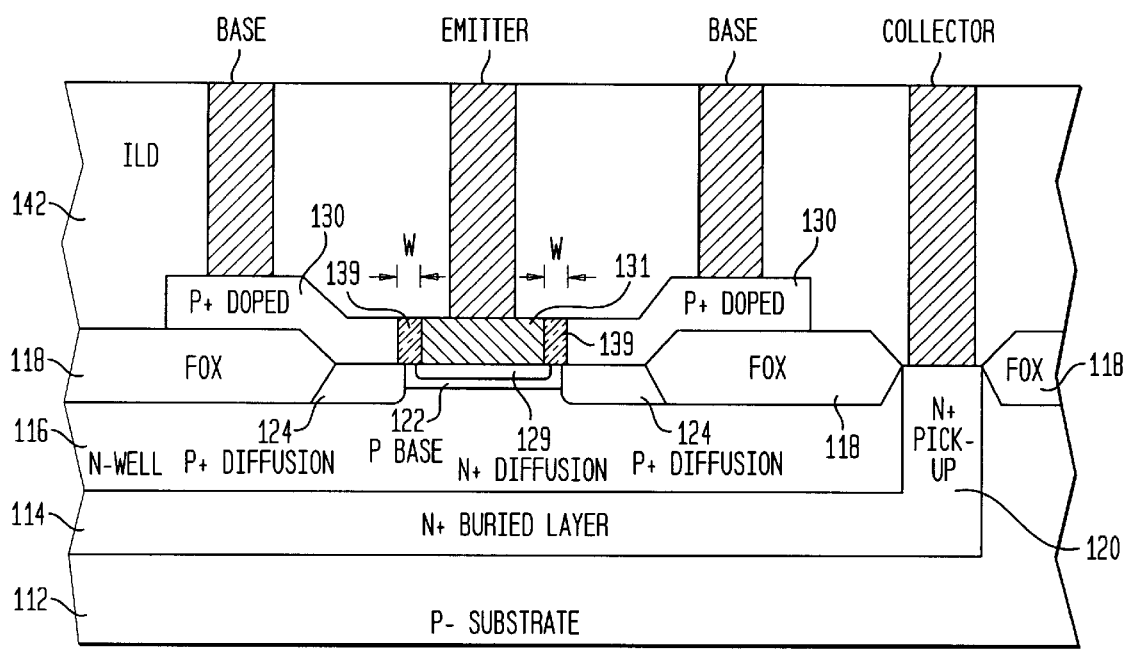

The width W between the N⁺ doped emitter 131 and the P⁺ doped base connector 130, as shown in FIG. 12, is equal to the width of the nitride spacers 132 (shown in FIG. 7). The width W is therefore easily controlled. Using the inventive method described above, a 0.3 µm trench width or less may be easily achieved without regard to the capability of photolithographic equipment. W should be large enough to prevent the N⁺ diffusion region 129 below N⁺ polysilicon (polycide) emitter 131 from coming in direct contact with the P⁺ diffusion regions 124 below the P⁺ polysilicon (polycide) base connectors 130. This width is directly related to emitter-to-base junction breakdown voltage and reverse junction leakage current. Under the constraints of BJT device characteristic specifications, W can be minimized to reduce the effects of the parasitic resistance $R_b$, parasitic capacitance $C_{bc}$, and the overall size of the BJT device.

Figure 1:
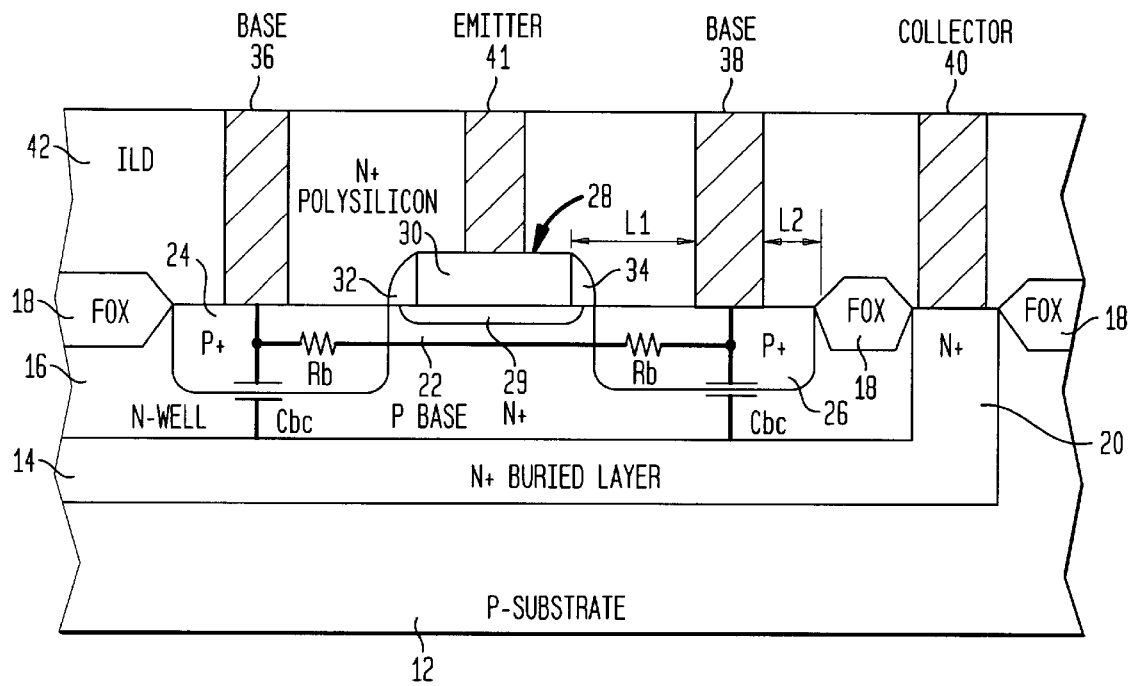
FIG. 1 schematically illustrates a conventional BJT.
Figure 2:
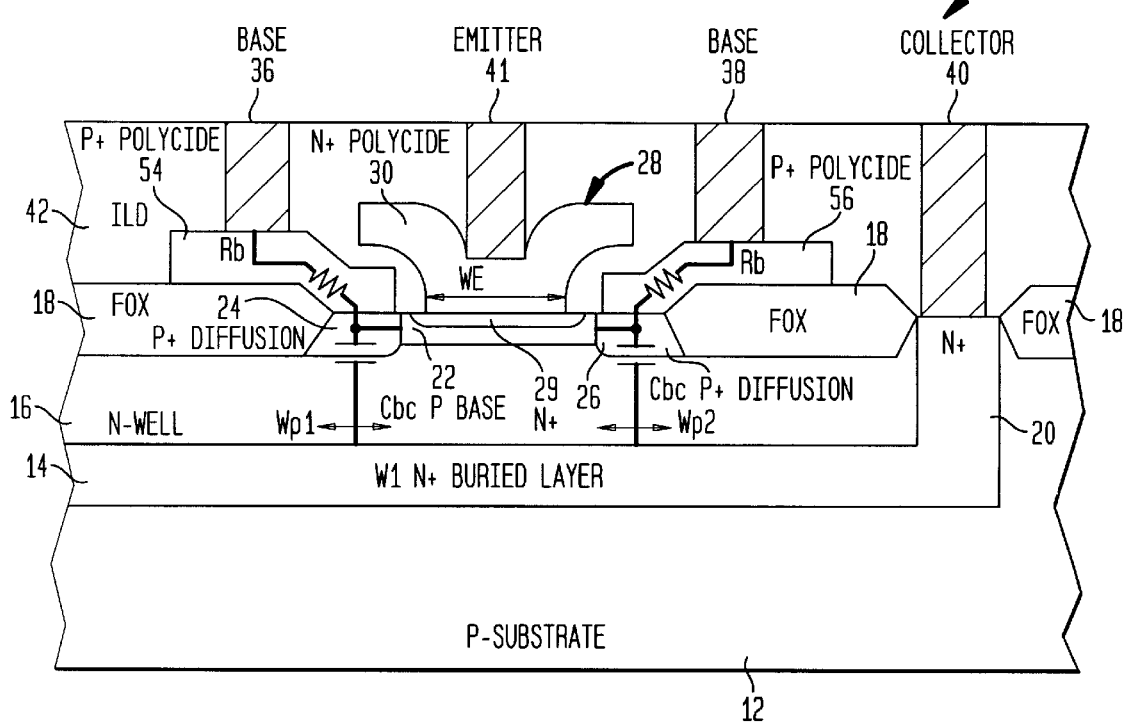
FIG. 2 schematically illustrates a first conventional BJT with a self-aligned base contact.
Figure 3:
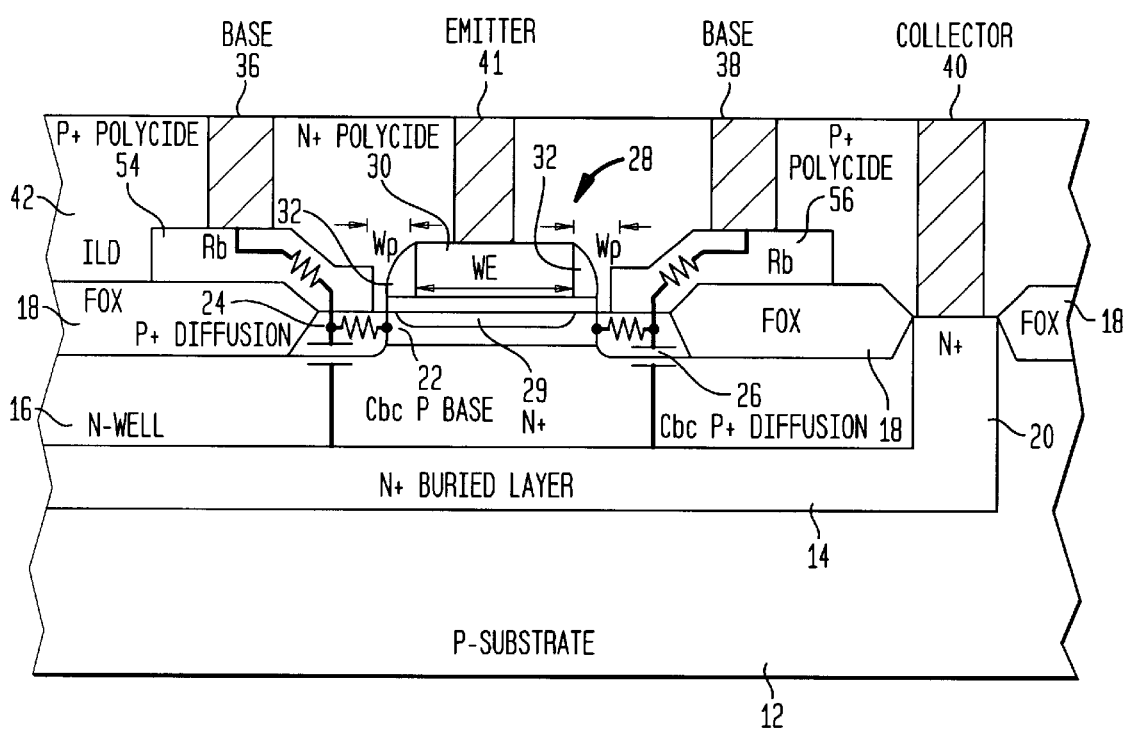
FIG. 3 schematically illustrates a second conventional BJT with a self-aligned base contact.

One advantage of the inventive BJT process is its simplicity. By using only one polysilicon (polycide) process, the BJT device performance is improved over the conventional device shown in FIG. 2. This is due to the fact that the device is smaller than that of the conventional BJT process using two polysilicon (polycide) processes. Another advantage of the inventive BJT process is that the device is scalable. Due to self-aligned emitter and base process nature, the BJT device is easily scaled down. The inventive BJT process also has the advantage over the prior art of being well controlled. This is true because the emitter of the proposed process is defined by photolithography. Furthermore, the effects of the parasitic resistance $R_b$ and parasitic capacitance $C_{bc}$ are reduced and therefore the device size is reduced.

Finally, the above discussion is intended to be merely illustrative of the invention. Numerous alternative embodiments may be devised by those having ordinary skill in the art without departing from the spirit and scope of the following claims.

The claimed invention is:

1. A method for forming a self-aligned bipolar junction transistor (BJT) having a reduced size and reduced parasitic resistor and parasitic capacitance effects comprising the steps of:

forming a first base region, an emitter region and a second base region over a semiconductor substrate, forming a pair of nitride spacers, each adjacent to said emitter region, doping said first and second base regions with an impurity of a first conductivity type, removing said pair of nitride spacers, forming trench regions through said emitter region in the area of the removed spacers, filling said trenches with a dielectric, and doping said emitter region with an impurity of a second conductivity type to form a self-aligned bipolar junction transistor (BJT) having a reduced size and reduced parasitic resistor and capacitance effects.

2. The method of claim 1 wherein said step of forming nitride spacers comprises the steps of:

depositing a nitride layer over said first base region, said emitter region and said second base region, and etching said nitride layer to form said spacers.

3. The method of claim 1 wherein the width of said trenches being less than or equal to approximately 0.3 µm.

4. The method of claim 1 further comprising the step of:

forming a collector region prior to said step of forming a first base region, an emitter region and a second base region.

* * * * *